(12) United States Patent
Kanarik

(10) Patent No.: US 9,214,320 B2
(45) Date of Patent: Dec. 15, 2015

(54) INERT-DOMINANT PULSING IN PLASMA PROCESSING SYSTEMS

(71) Applicant: Lam Research Corporation, Fremont, CA (US)

(72) Inventor: Keren Jacobs Kanarik, Folsom, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/327,270

(22) Filed: Jul. 9, 2014

(65) Prior Publication Data

US 2014/0319098 A1    Oct. 30, 2014

Related U.S. Application Data

(63) Continuation of application No. 13/550,547, filed on Jul. 16, 2012, now Pat. No. 8,808,561.

(60) Provisional application No. 61/560,005, filed on Nov. 15, 2011.

(51) Int. Cl.
*C03C 15/00* (2006.01)
*H01J 37/32* (2006.01)
*H05H 1/46* (2006.01)

(52) U.S. Cl.
CPC ...... *H01J 37/32137* (2013.01); *H01J 37/32082* (2013.01); *H01J 37/32146* (2013.01); *H01J 37/32165* (2013.01); *H01J 37/32449* (2013.01); *H05H 1/46* (2013.01); *H05H 2001/4682* (2013.01)

(58) Field of Classification Search
CPC ...... H01J 37/32082; H01J 37/32137; H01J 37/32146

USPC ........... 216/63, 67; 204/192.32, 298.07, 204/298.33; 156/345.33; 427/248.1, 255.3, 427/255.23
See application file for complete search history.

(56) References Cited

U.S. PATENT DOCUMENTS 4,935,661 A * 6/1990 Heinecke et al. ........ 313/231.31
5,164,040 A    11/1992 Eres
5,252,178 A    10/1993 Moslehi (Continued)

OTHER PUBLICATIONS

International Preliminary Report on Patentability dated May 20, 2014 from International Application No. PCT/IB2012/056348.

(Continued)

*Primary Examiner* — Duy Deo
*Assistant Examiner* — Maki Angadi
(74) *Attorney, Agent, or Firm* — Beyer Law Group LLP

(57) ABSTRACT

A method for processing substrate in a processing chamber, which has at least one plasma generating source and a gas source for providing process gas into the chamber, is provided. The method includes exciting the plasma generating source with an RF signal having RF frequency. The method further includes pulsing the gas source, using at least a first gas pulsing frequency, such that a first process gas is flowed into the chamber during a first portion of a gas pulsing period and a second process gas is flowed into the chamber during a second portion of the gas pulsing period, which is associated with the first gas pulsing frequency. The second process gas has a lower reactant-gas-to-inert-gas ratio relative to a reactant-gas-to-inert-gas ratio of the first process gas. The second process gas is formed by removing at least a portion of a reactant gas flow from the first process gas.

20 Claims, 8 Drawing Sheets

(56) References Cited

U.S. PATENT DOCUMENTS

| | | |
|---|---|---|
| 6,020,686 A | 2/2000 | Ye et al. |
| 6,165,311 A | 12/2000 | Collins et al. |
| 7,081,414 B2 | 7/2006 | Zhang et al. |
| 7,166,233 B2 * | 1/2007 | Johnson et al. ............. 216/67 |
| 2002/0160125 A1 | 10/2002 | Johnson |
| 2012/0152895 A1 | 6/2012 | Chebi et al. |

OTHER PUBLICATIONS

C.B. Schroeder et al., "Frequency chirp and pulse shape effects in self-modulated laser wakefield accelerators", Physics of Plasmas, vol. 10, No. 5, May 2003.

* cited by examiner

702 ADAD...

704 ABABAB/ADAD/ABABAB/ADAD

706 ABABAB/ACAC/ABABAB/ACAC

708 ABABAB/CDCD/ABABAB/CDCD

710 ABABAB/CDCD/ADAD/ABABAB/CDCD/ADAD

FIG. 7B

INERT-DOMINANT PULSING IN PLASMA PROCESSING SYSTEMS

CROSS REFERENCE TO RELATED APPLICATIONS

This application is a continuation of and claims priority under 35 U.S.C. §120 to co-pending U.S. patent application Ser. No. 13/550,547, filed Jul. 16, 2012, entitled "INERT-DOMINANT PULSING IN PLASMA PROCESSING SYSTEMS," which claims priority under 35 USC. 119(e) to U.S. Provisional Patent Application No. 61/560,005, filed on Nov. 15, 2011 entitled "INTER-DOMINANT PULSING IN PLASMA PROCESSING SYSTEMS" all of which are incorporated herein by reference in their entirety for all purposes.

BACKGROUND OF THE INVENTION

Plasma processing systems have long been employed to process substrates (e.g., wafers or flat panels or LCD panels) to form integrated circuits or other electronic products. Popular plasma processing systems may include capacitively coupled plasma processing systems (CCP) or inductively coupled plasma processing systems (ICP), among others.

Generally speaking, plasma substrate processing involves a balance of ions and radicals (also referred to as neutrals). For example, with a plasma that has more radicals than ions, etching tends to be more chemical and isotropic. With a plasma that has more ions than radicals, etching tends to be more physical and selectivity tends to suffer. In a traditional plasma chamber, ions and radicals tend to be closely coupled. Accordingly, the process window (with respect to processing parameters) tends to be fairly narrow due to the fact that there are limited control knobs to independently achieve an ion-dominant plasma or a radical-dominant plasma.

As electronic devices become smaller and/or more complex, etching requirements such as selectivity, uniformity, high aspect ratio, aspect dependent etching, etc., have increased. While it has been possible to perform etches on the current generation of products by changing certain parameters such as pressure, RF bias, power, etc., the next generation of smaller and/or more sophisticated products demand different etch capabilities. The fact that ions and radicals cannot be more effectively decoupled and independently controlled has limited and in some cases made it impractical to perform some etch processes to manufacture these smaller and/or more sophisticated electronic devices in some plasma processing systems.

In the prior art, attempts have been made to obtain plasma conditions to modulate the ion-to-radical ratio at different times during an etch. In a conventional scheme, the source RF signal may be pulsed (e.g., on and off) in order to obtain a plasma that has the normal ion to neutral flux ratio during one phase of the pulse cycle (e.g., the pulse on phase) and a plasma with lower ion to neutral flux ratio during another phase of the pulse cycle (e.g., during the pulse off phase). It is known that source RF signal may be pulsed synchronously with bias RF signal.

However, it has been observed that while the prior art pulsing has, to some extent, resulted in alternate phases of normal ion to neutral flux ratio plasmas at different points in time and has opened up the operating window for some processes, larger operating windows are still desired.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 7A and 7B illustrate, in accordance with embodiments of the invention, different example variations of the gas pulsing scheme discussed in connection with FIG. 6.

DETAILED DESCRIPTION OF EMBODIMENTS

Figure 1:
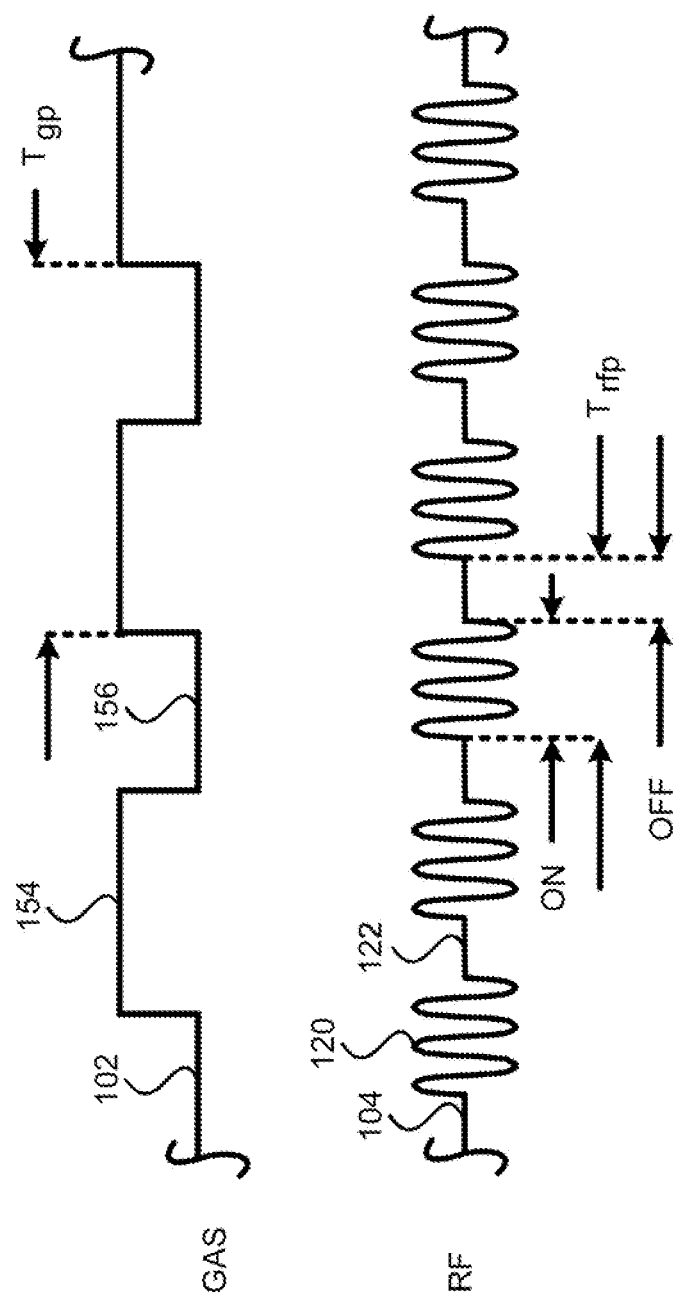
FIG. 1 shows, in accordance with one or more embodiments of the invention, an example combination pulsing scheme where the input gas (such as reactant gas and/or inert gas) and the source RF signal are both pulsed, albeit at different pulsing frequencies.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention related to a combination pulsing scheme that pulses the input gas (e.g., reactant gases and/or inert gases) using a first pulsing frequency and the source RF signal at a different second pulsing frequency. Although an inductively coupled plasma processing system and an inductive RF power source are employed to discuss in the examples herein, it should be understood that embodiments of the invention apply equally to capacitively coupled plasma processing systems and capacitive RF power sources.

In one or more embodiments, the input gas is pulsed at a slower pulsing frequency, and the inductive source RF signal is pulsed at a different, faster pulsing frequency in an inductively coupled plasma processing system. For example, if the inductive source RF signal is at 13.56 MHz, the inductive source RF signal may be pulsed at, for example, 100 Hz while the gas is pulsed at a different pulsing rate, such as 1 Hz.

Thus, a complete gas pulse cycle is 1 second in this example. If the gas pulsing duty cycle is 70%, the gas may be on for 70% of the 1-second gas pulsing period and off for 30% of the 1-second gas pulsing period. Since the source RF signal pulsing rate is 100 Hz, a complete RF signal pulsing period is 10 ms. If the RF pulsing duty cycle is 40%, the RF on-phase (when the 13.56 MHz signal is on) is 40% of the 10 ms RF pulsing period and the RF off phase (when the 13.56 MHz signal is off) is 60% of the 10 ms RF pulsing period.

In one or more embodiments, the inductive source RF signal may be pulsed with two different frequencies while the gas is pulsed at its own gas pulsing frequency. For example, the aforementioned 13.56 MHz RF signal may be pulsed not only at frequency f1 of 100 Hz but may also be pulsed with a different, higher frequency during the on-phase of frequency f1. For example, if the RF pulsing duty cycle is 40% of the f1 pulse, the on-phase of f1 is 40% of 10 ms or 4 ms. However, during that 4 ms on-phase of f1, the RF signal may also be pulsed at a different, higher frequency of f2 (such as at 400 Hz).

Embodiments of the invention contemplate that the gas pulses and RF pulses may be synchronous (i.e., with matching leading edge and/or lowering edge of the pulse signals) or may be asynchronous. The duty cycle may be constant or may vary in a manner that is independent of the other pulsing frequency or in a manner that is dependent on the other pulsing frequency.

In one or more embodiments, frequency chirping may be employed. For example, the RF signal may change its fundamental frequency in a periodic or non-periodic manner so that during a phase or a portion of a phase of any of the pulsing periods (e.g., any of the RF signal or gas pulsing periods), a different frequency (e.g., 60 MHz versus 13.56 MHz) may be employed. Likewise, the gas pulsing frequency may be changed with time in a periodic or non-periodic manner if desired.

In one or more embodiments, the aforementioned gas and source RF pulsing may be combined with one or more pulsing or variation of another parameter (such as pulsing of the bias RF signal, pulsing of the DC bias to the electrode, pulsing of the multiple RF frequencies at different pulsing frequencies, changing the phase of any of the parameters, etc.).

The features and advantages of embodiments of the invention may be better understood with reference to the figures and discussions that follow.

FIG. 1 shows, in accordance with an embodiment of the invention, an example combination pulsing scheme where the input gas (such as reactant gas and/or inert gas) and the source RF signal are both pulsed, albeit at different pulsing frequencies. In the example of FIG. 1, the input gas 102 is pulsed at a gas pulsing rate (defined as $1/T_{gp}$, where $T_{gp}$ is the period of the gas pulse) of about 2 seconds/pulse or 2 MHz.

The TCP source RF signal 104 of 13.56 MHz is pulsed at a RF pulsing rate (defined as $1/T_{rfp}$, where $T_{rfp}$ is the period of the RF pulsing). To clarify the concept of RF pulsing herein, the RF signal is on (such as the 13.56 MHz RF signal) during the time period 120 and the RF signal is off during the time period 122. Each of the gas pulsing rate and the RF pulsing rate may have its own duty cycle (defined as the pulse on-time divided by the total pulsing period). There are no requirements that the duty cycle has to be 50% for any of the pulse signals, and the duty cycle may vary as needed for a particular process.

In an embodiment, the gas pulsing and the RF signal pulsing are at the same duty cycle. In another embodiment, the gas pulsing and the RF signal pulsing are at independently controllable (and may be different) duty cycles to maximize granular control. In one or more embodiments, the leading and/or trailing edges of the gas pulsing signal and the RF pulsing signal may be synchronous. In one or more embodiments, the leading and/or trailing edges of the gas pulsing signal and the RF pulsing signal may be asynchronous.

Figure 2:
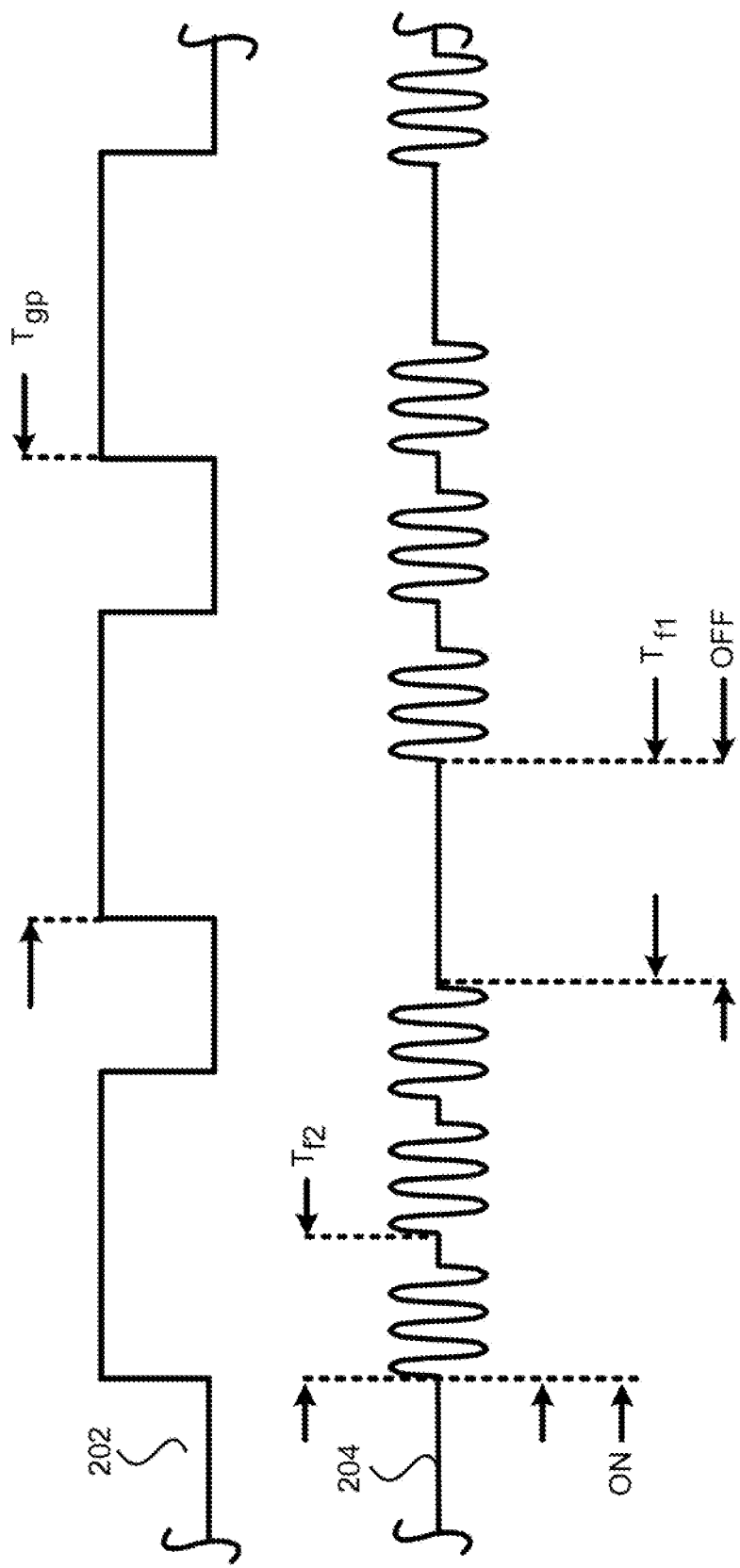
FIG. 2 shows, in accordance with one or more embodiments of the invention, another example combination pulsing scheme.

In FIG. 2, the gas input 202 is pulsed at its own gas pulsing frequency. However, the source RF signal 204 may be pulsed with two different frequencies while the gas is pulsed at its own gas pulsing frequency (defined as $1/T_{gp}$, where $T_{gp}$ is the period of the gas pulse). For example, the RF signal may be pulsed not only at frequency f1 (defined as $1/T_{f1}$ from the figure) but may also be pulsed with a different, higher frequency during the on-phase of f1 pulsing. For example, during this on-phase of f1 pulsing, the RF signal may be pulsed at a different pulsing frequency f2 (defined as $1/T_{f2}$ from the figure).

Figure 3:
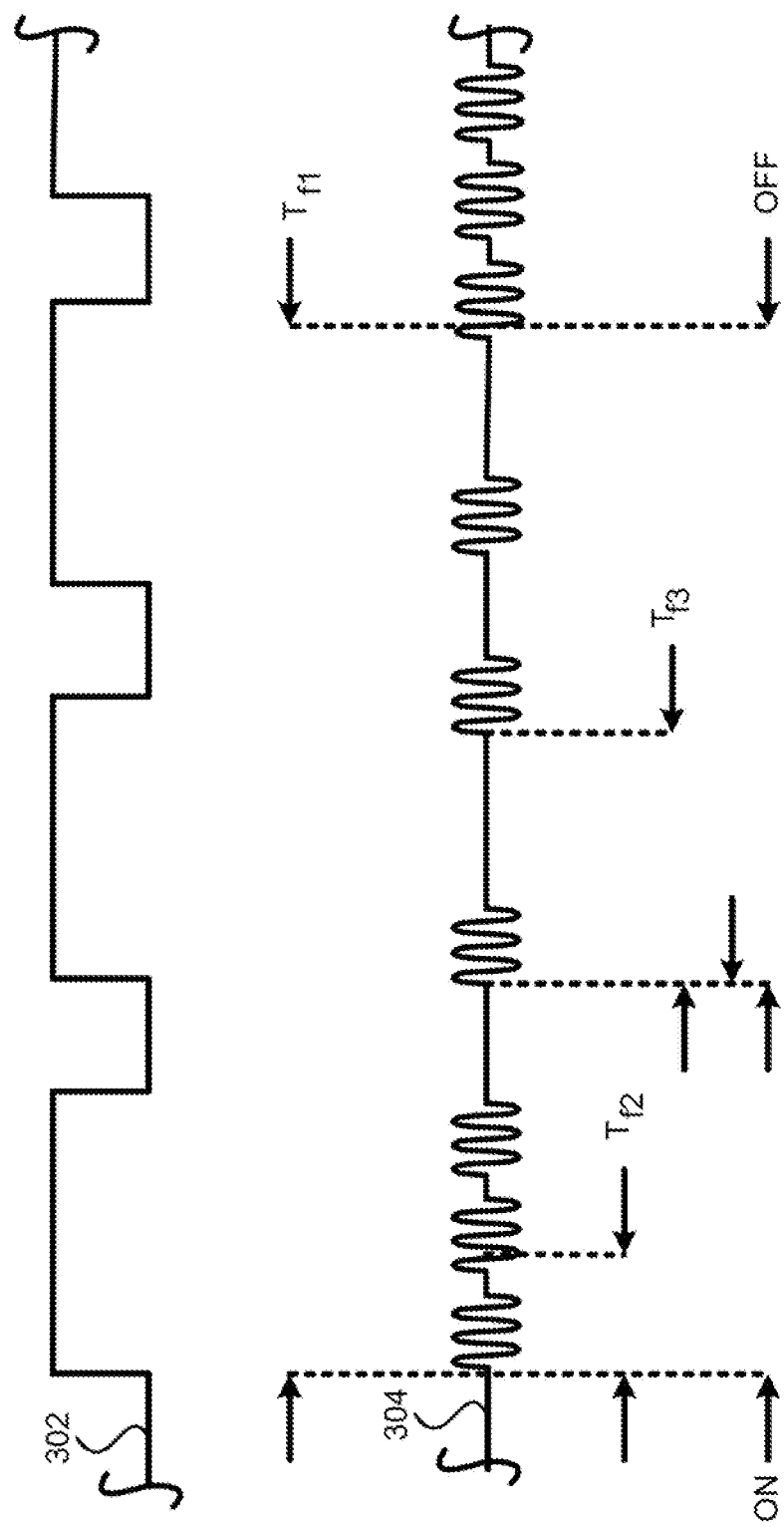
FIG. 3 shows, in accordance with one or more embodiments of the invention, yet another example combination pulsing scheme.

In FIG. 3, the gas input 302 is pulsed at its own gas pulsing frequency. However, the source RF signal 304 may be pulsed with three different frequencies while the gas is pulsed at its own gas pulsing frequency. For example, the RF signal may be pulsed not only at frequency f1 (defined as $1/T_{f1}$ from the figure) but may also be pulsed with a different, higher frequency during the on-phase of f1 pulsing. Thus, during this on-phase of f1 pulsing, the RF signal may be pulsed at a different pulsing frequency f2 (defined as $1/T_{f2}$ from the figure. During the off-phase of f1 pulsing, the RF signal may be pulsed at a different pulsing frequency f3 (defined as $1/T_{f3}$ from the figure).

Additionally or alternatively, although the duty cycle is shown to be constant in the examples of FIGS. 1-3, the duty cycle may also vary, in a periodic or non-periodic manner and independently or dependently on the phases of one of the pulsing signals (whether gas pulsing signal, RF pulsing signal, or otherwise). Further, the change in the duty cycle may be synchronous or asynchronous with respect to phase of any one of the pulsing signals (whether gas pulsing signal, RF pulsing signal, or otherwise).

In one embodiment, the duty cycle of the RF pulsing is advantageously set to be one value during the on-phase of the gas pulse (e.g., 154 in FIG. 1), and the duty cycle of the RF pulsing is set to be another different value during the off-phase of the gas pulse (e.g., 156 of FIG. 1). In a preferred embodiment, the duty cycle of the RF pulsing is advantageously set to be one value during the on-phase of the gas pulse (e.g., 154 in FIG. 1) and the duty cycle of the RF pulsing is set to be a lower value during the off-phase of the gas pulse (e.g., 156 of FIG. 1). It is contemplated that this RF pulsing duty cycle embodiment wherein the duty cycle is higher during the on phase of the gas pulsing and lower during the off phase of the gas pulsing is advantageous for some etches. It is contemplated that this RF pulsing duty cycle variance wherein the duty cycle is lower during the on phase of the gas pulsing and higher during the off phase of the gas pulsing is advantageous for some etches. As the term is employed herein, when a signal is pulsed, the duty cycle is other than 100% during the time when the signal is pulsed (i.e., pulsing and "always on" are two different concepts).

Additionally or alternatively, frequency chirping may be employed with any of the pulsing signals (whether gas pulsing signal, RF pulsing signal, or otherwise). Frequency chirping is described in greater detail in connection with the RF pulsing signal in FIG. 4 below.

In one or more embodiments, the gas is pulsed such that during the gas pulsing on phase, reactant gas (es) and inert gas (es) (such as Argon, Helium, Xenon, Krypton, Neon, etc.)

are as specified by the recipe. During the gas pulsing off phase, at least some of both the reactant gas (es) and inert gas (es) may be removed. In other embodiments, at least some of the reactant gas (es) is removed and replaced by inert gas (es) during the gas pulsing off phase. In an advantageous, at least some of the reactant gas (es) is removed and replaced by inert gas (es) during the gas pulsing off phase to keep the chamber pressure substantially the same.

In one or more embodiments, during the gas pulsing off phase, the percentage of inert gas (es) to total gas (es) flowed into the chamber may vary from about X % to about 100%, wherein X is the percentage of inert gas (es) to total gas flow that is employed during the gas pulsing on phase. In a more preferred embodiment, the percentage of inert gas (es) to total gas (es) flowed into the chamber may vary from about 1.1 X to about 100%, wherein X is the percentage of inert gas (es) to total gas flow that is employed during the gas pulsing on phase. In a preferred embodiment, the percentage of inert gas (es) to total gas (es) flowed into the chamber may vary from about 1.5 X to about 100%, wherein X is the percentage of inert gas (es) to total gas flow that is employed during the gas pulsing on phase.

The gas pulsing rate is limited at the high end (upper frequency limit) by the residence time of the gas in the chamber. This residence time concept is one that is known to one skilled in the art and varies from chamber design to chamber design. For example, residence time typically ranges in the tens of milliseconds for a capacitively coupled chamber. In another example, residence time typically ranges in the tens of milliseconds to hundreds of milliseconds for an inductively coupled chamber.

In one or more embodiments, the gas pulsing period may range from 10 milliseconds to 50 seconds, more preferably from 50 milliseconds to about 10 seconds and preferably from about 500 milliseconds to about 5 seconds.

The source RF pulsing period is lower than the gas pulsing period in accordance with embodiments of the invention. The RF pulsing frequency is limited at the upper end by the frequency of the RF signal (e.g., 13.56 MHz would establish the upper limit for the RF pulsing frequency if the RF frequency is 13.56 MHz).

Figure 4:
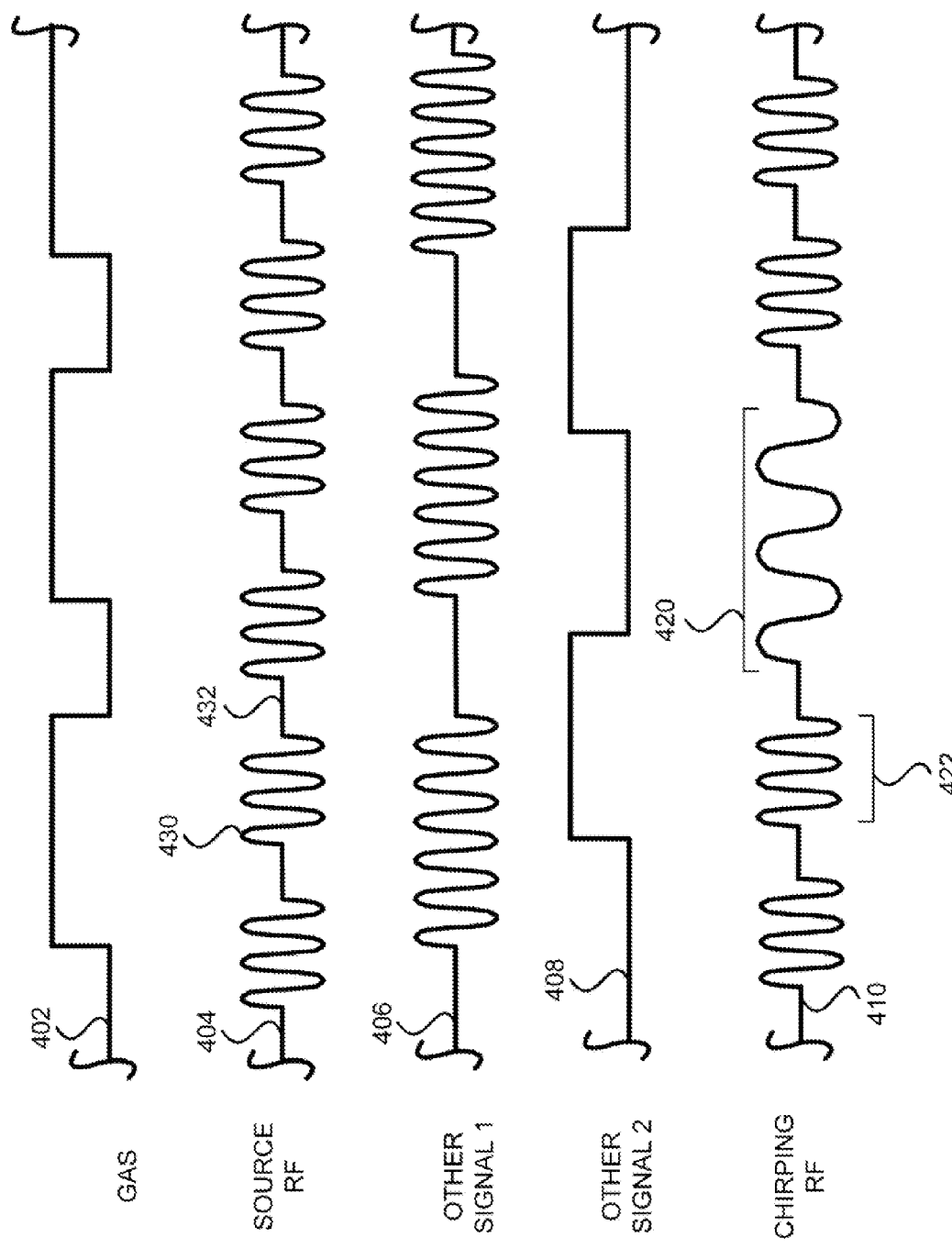
FIG. 4 shows, in accordance with one or more embodiments of the invention, other possible combinations for the combination pulsing scheme.

FIG. 4 shows, in accordance with one or more embodiments of the invention, other possible combinations. In FIG. 4, another signal 406 (such as bias RF or any other periodic parameter) may be pulsed along with gas pulsing signal 402 and source RF pulsing signal 404 (pulsed as shown with 430 and 432). The pulsing of signal 406 may be made synchronous or asynchronous with any other signals in the system.

Alternatively or additionally, another signal 408 (such as DC bias or temperature or pressure or any other non-periodic parameter) may be pulsed along with gas pulsing signal 402 and source RF pulsing signal 404. The pulsing of signal 408 may be made synchronous or asynchronous with any other signals in the system.

Alternatively or additionally, another signal 410 (such as RF source or RF bias or any other non-periodic parameter) may be chirped and pulsed along with gas pulsing signal 402. For example, while signal 410 is pulsing, the frequency of signal 410 may vary depending on the phase of signal 410 or another signal (such as the gas pulsing signal) or in response to a control signal from the tool control computer. In the example of FIG. 1, reference 422 points to a region of higher frequency than the frequency associated with reference number 420. An example of a lower frequency 422 may be 27 MHz and a higher frequency 420 may be 60 MHz. The pulsing and/or chirping of signal 410 may be made synchronous or asynchronous with any other signals in the system.

Figure 5:
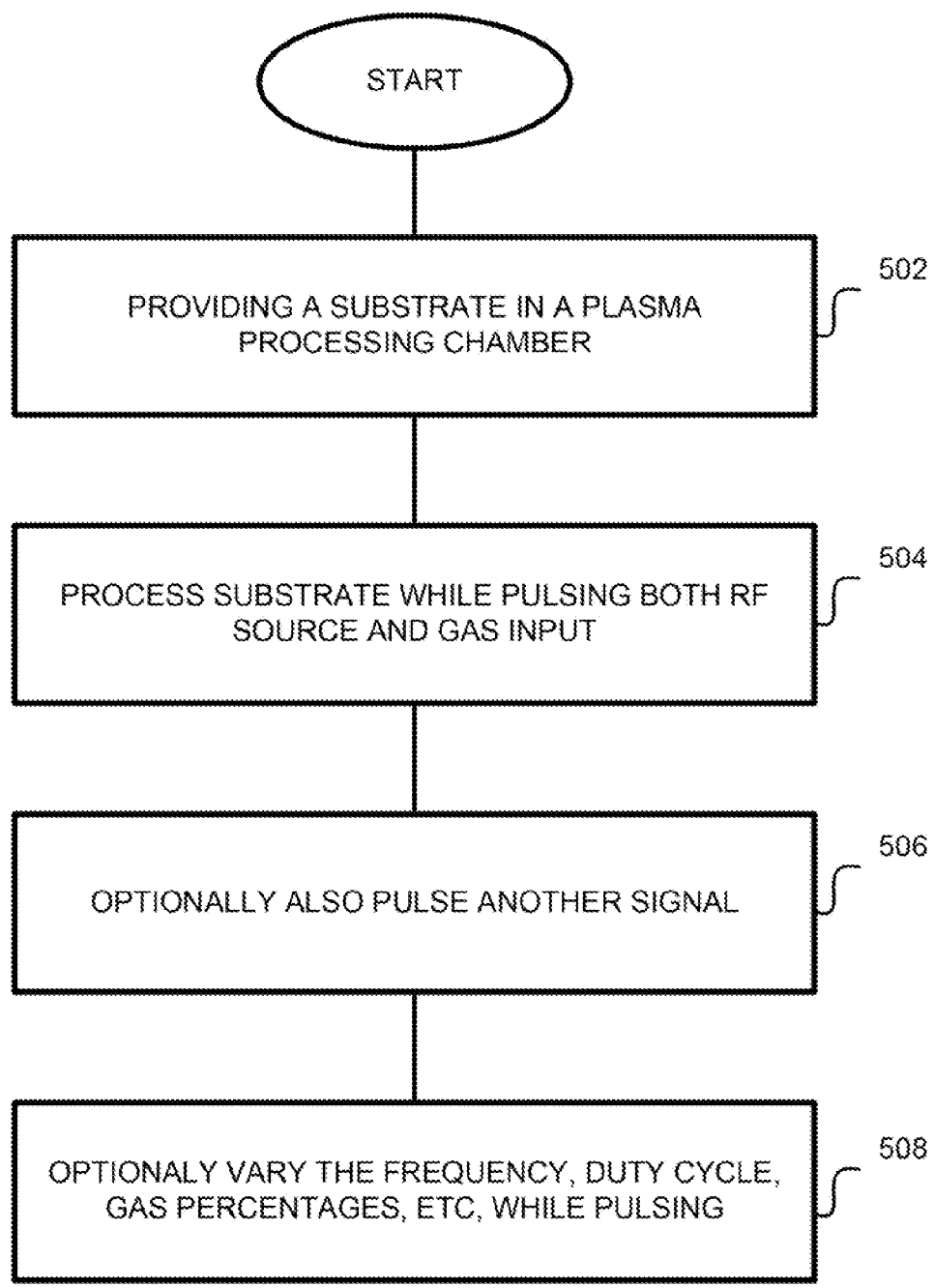
FIG. 5 shows, in accordance with one or more embodiments of the invention, the steps for performing combination pulsing.

FIG. 5 shows, in accordance with an embodiment of the invention, the steps for performing combination pulsing. The steps of FIG. 5 may be executed via software under control of one or more computers, for example. The software may be stored in a computer readable medium, including a non-transitory computer readable medium in one or more embodiments.

In step 502, a substrate is provided in a plasma processing chamber. In step 504, the substrate is processed while pulsing both the RF source and the input gas. Optional pulsing of one or more other signals (such as RF bias or another signal) is shown in step 506. In step 508, the frequency, duty cycle, gas percentages, etc. may optionally be varied while pulsing the RF source and the input gas.

In one or more embodiments, the gas is pulsed such that there are at least two phases per cycle, with cycles repeating periodically. The other parameters, including the RF source signal, may be left unpulsed. During the first phase, the reactant gas (which may comprise multiple different etching and/or polymer-forming gases) to inert gas (such as one or more of Argon, Helium, Xenon, Krypton, Neon, etc.) ratio is at a first ratio. During the second phase, the reactant gas to inert gas ratio is at a second ratio different from the first ratio. If the ratio of reactant gas flow to total gas flow into the chamber is reduced (i.e., the ratio of inert gas to total gas flow into the chamber is increased) during the second phase, the chamber contains a higher percentage of the inert gas during the second phase than in the first phase. In this case, an ion-dominant plasma results wherein the plasma ion flux is formed primarily with inert gas to perform the etching.

This is unlike the prior art situation where reactant gas is added to pulse the gas. By increasing the percentage of the inert gas in the chamber without increasing the reactant gas flow into the chamber, embodiments of the invention achieve an ion-rich plasma to improve etch uniformity, directionality and/or selectivity.

In an embodiment, the ratio is changed not by adding any reactant (such as etchant or polymer-forming) gases into the chamber but by reducing the reactant gases flow rate such that the flow percentage of inert gas to reactant gas increases. In this embodiment, the chamber pressure would inherently reduce during the second phase.

Alternatively or additionally, the ratio of reactant gas (es) to inert gas (es) may be changed by increasing the inert gas (es) flow into the chamber while keeping the reactant gas (es) flow into the chamber either constant or by reducing the reactant gas (es) flow (but not by increasing the reactant gases flow into the chamber). In an embodiment, the flow of inert gas is increased to offset the reduction in the flow of reactant gas. In this embodiment, the chamber pressure remains substantially the same during the first and second phases. In another embodiment, the flow of inert gas is increased but is insufficient to fully offset the reduction in the flow of reactant gas. In this embodiment, the chamber pressure is reduced during the second phase. In another embodiment, the flow of inert gas is increased more than sufficient to offset the reduction in the flow of reactant gas. In this embodiment, the chamber pressure is increased during the second phase.

As mentioned, in one or more embodiments, during the gas pulsing second phase, the percentage of inert gas (es) to total gas (es) flowed into the chamber may vary from about X % to about 100%, wherein X is the percentage of inert gas (es) to total gas flow that is present when the plasma chamber is stabilized for processing or the percentage of inert gas (es) to total gas flow that is present during the first phase. In a more preferred embodiment, the percentage of inert gas (es) to total gas (es) flowed into the chamber may vary from about 1.1 X to about 100%. In a preferred embodiment, the percentage of inert gas (es) to total gas (es) flowed into the chamber may vary from about 1.5 X to about 100% during the second phase.

The gas pulsing rate is limited at the high end (upper frequency limit) by the residence time of the gas in the chamber. As mentioned, for example, residence time typically ranges in the tens of milliseconds for a capacitively coupled chamber. In another example, residence time typically ranges in the tens of milliseconds to hundreds of milliseconds for an inductively coupled chamber. Also as mentioned, in one or more embodiments, the gas pulsing period may range from 10 milliseconds to 50 seconds, more preferably from 50 milliseconds to about 10 seconds and preferably from about 500 milliseconds to about 5 seconds.

In one or more embodiments, the inert gas added during the second phase of the periodic pulsing may be the same inert gas or a different inert gas with different chemical composition and/or different constituent gases. Alternatively or additionally, the duty cycle of the gas pulsing rate may vary from 1% to 99%. Alternatively or additionally, the gas pulsing rate may be chirped, i.e., may change, during processing. For example, the gas pulsing may be done with a 5-second gas pulsing period with a 40% duty cycle and then switched to a 9-second gas pulsing period with either the same 40% duty cycle or a different duty cycle. The chirping may be done periodically in accordance with a chirping frequency (such as 20 second chirping frequency wherein the gas pulsing frequency may be changed every 20 seconds).

Figure 6:
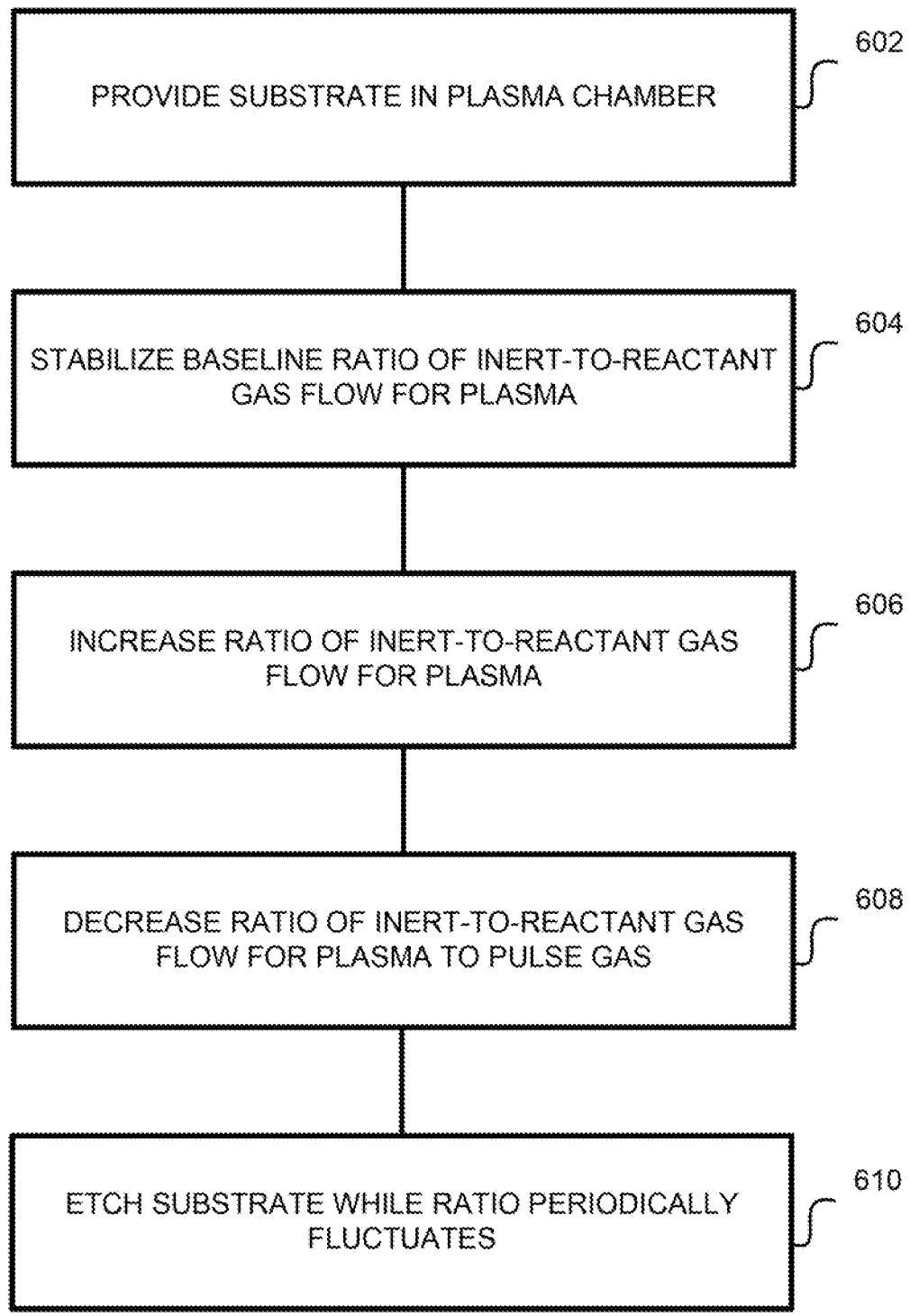
FIG. 6 shows, in accordance with one or more embodiments of the invention, the steps for performing gas pulsing.

FIG. 6 shows, in accordance with one or more embodiments of the invention, the steps for performing gas pulsing. The steps of FIG. 6 may be executed via software under control of one or more computers, for example. The software may be stored in a computer readable medium, including a non-transitory computer readable medium in one or more embodiments.

In step 602, a substrate is provided in a plasma processing chamber. In step 604, a plasma is generated in the chamber and stabilized with a baseline ratio of inert gas flow to reactant gas flow. In step 606, the ratio of inert gas flow to reactant gas flow is increased in one phase of the gas pulsing without increasing the reactant gas flow into the chamber. In step 608, the ratio of inert gas flow to reactant gas flow is decreased, relative to the ratio of inert gas flow to reactant gas flow of step 606, in another phase of the gas pulsing without increasing the reactant gas flow into the chamber. In various embodiments, the ratio of inert gas flow to reactant gas flow in step 608 may be the substantially the same as the ratio of inert gas flow to reactant gas flow of step 604 (stabilize plasma step) or may be higher or lower than the ratio of inert gas flow to reactant gas flow of stabilize step 604. In step 610, the substrate is processed while the gas is pulsed by having the aforementioned inert-to-reactant flow ratio fluctuates periodically with the ratios of steps 606 and 608.

Figure 7A:
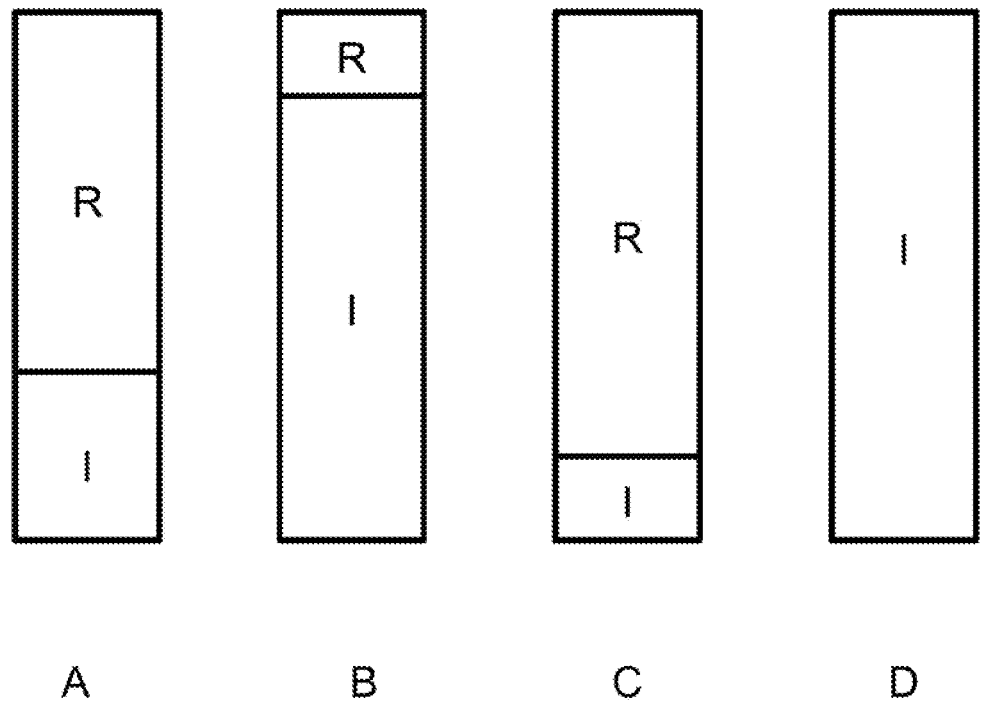

FIGS. 7A and 7B illustrate, in accordance with embodiments of the invention, different example variations of the gas pulsing scheme discussed in connection with FIG. 6. In the example of FIG. 7A, cases A, B, C and D represents the various ratio of inert gas to reactant gas. In case A, the ratio of inert gas (I) to reactant gas (R) is 3:7, for example. In case B, the ratio of inert gas to reactant gas is 8:1, for example. In case C, the ratio of inert gas to reactant gas is 1:9, for example. In case D, the gas flow into the chamber is essentially all inert. While example ratio values are given, the exact values of the ratios are only illustrative; the important point is that these cases all have different ratios relative to one another.

In FIG. 7B, an example pulsing 702 may be ADAD in a preferred embodiment where the gas pulse may fluctuate periodically between case A and case D of FIG. 7A and repeat.

Another example pulsing 704 may be ABABAB/ADAD/ABABAB/ADAD where the gas pulse may fluctuate periodically between case A and case B of FIG. 7A, then between cases A and D of FIG. 7A, and then back to cases A and B of FIG. 7A and repeat.

Another example pulsing 706 may be ABABAB/ACAC/ABABAB/ACAC where the gas pulse may fluctuate periodically between case A and case B of FIG. 7A, then between cases A and D of FIG. 7A, and then back to cases A and B of FIG. 7A and repeat.

Another example pulsing 708 may be ABABAB/CDCD/ABABAB/CDCD where the gas pulse may fluctuate periodically between case A and case B of FIG. 7A, then between cases C and D of FIG. 7A, and then back to cases A and B of FIG. 7A and repeat.

Another example pulsing 710 may be ABABAB/CDCD/ADAD/ABABAB/CDCD/ADAD where the gas pulse may fluctuate periodically between case A and case B of FIG. 7A, then between cases C and D of FIG. 7A, then between cases A and D of FIG. 7A and then back to cases A and B of FIG. 7A and repeat.

Other examples may include 4 phases such as ABAB/CDCD/ADAD/ACAC and repeat. The complex pulsing is highly advantageous for processes involving, for example, in-situ etch-then-clean or multi-step etches, etc.

In another embodiment, the gas pulsing of FIGS. 6, 7A and 7B may be combined with asynchronous or synchronous pulsing of the RF bias signal that is supplied to the powered electrode. In an example, when the gas is pulsed to a high inert gas percentage or 100% or near 100% inert gas percentage in one phase of the gas pulsing cycle, the RF bias signal is pulsed high. When the gas is pulsed to a lower inert gas percentage in another phase of the gas pulsing cycle, the RF bias signal is pulsed low or zero. In various embodiments, the pulsing frequency of the RF bias signal may be the same or different compared to the pulsing frequency of the gas pulsing. In various embodiments, the duty cycle of the RF bias signal may be the same or different compared to the duty cycle of the gas pulsing. Chirping may be employed with one or both of the RF bias signal pulsing and the gas pulsing if desired.

In each of the gas pulsing examples, the pulsing frequency, the number of pulses, the duty cycle, etc., may be varied kept constant throughout the etch or may vary periodically or non-periodically as required.

As can be appreciated from the foregoing, embodiments of the invention provide another control knob that can widen the process window for etch processes. Since many current plasma chambers are already provided with pulsing valves or pulsing mass flow controllers, the implementation of gas-pulsing in accordance with FIGS. 6-7A/7B and the discussion herein may be achieved without requiring expensive hardware retrofitting. Further, if RF pulsing is desired in conjunction with gas pulsing, many current plasma chambers are already provided with pulse-capable RF power supplies. Accordingly, the achievement of a wider process window via gas/RF power pulsing may be obtained without requiring expensive hardware retrofitting. Current tool owners may leverage on existing etch processing systems to achieve improved etches with minor software upgrade and/or minor hardware changes. Further, by having improved and/or more granular control of the ion-to-radical flux ratios, selectivity and uniformity and reverse RIE lag effects may be improved. For example, by increasing the ion flux relative to radical flux may improve the selectivity of one layer to another layer on the substrate in some cases. With such improved control of ion-to-radical, atomic layer etch (ALE) may be more efficiently achieved.

While this invention has been described in terms of several preferred embodiments, there are alterations, permutations, and equivalents, which fall within the scope of this invention. For example, the pulsing techniques discussed in the figures may be combined in any combination to suit the requirement of a particular process. For example, the duty cycle variance may be practiced with techniques discussed with any one (or part of any one or a combination of multiple ones) of the figures. Likewise, the frequency chirping may be practiced with techniques discussed with any one (or part of any one or a combination of multiple ones) of the figures and/or with duty cycle variance. Likewise, inert gas substitution may be practiced with techniques discussed with any one (or part of any one or a combination of multiple ones) of the figures and/or with duty cycle variance and/or with frequency chirping. The point is although techniques are discussed individually and/or in connection with a specific figure, the various techniques can be combined in any combination in order to perform a particular process.

Although various examples are provided herein, it is intended that these examples be illustrative and not limiting with respect to the invention. Also, the title and summary are provided herein for convenience and should not be used to construe the scope of the claims herein. If the term "set" is employed herein, such term is intended to have its commonly understood mathematical meaning to cover zero, one, or more than one member. It should also be noted that there are many alternative ways of implementing the methods and apparatuses of the present invention.

What is claimed is:

1. A method for etching using atomic layer etching in a plasma processing chamber of a plasma processing system, said plasma processing chamber having at least one plasma generating source and at least a gas source for providing a process gas into an interior region of said plasma processing chamber, comprising providing a plurality of cycles, wherein each cycle comprises:
   flowing a first gas comprising a reactant gas and an inert gas into said processing chamber;
   providing a first RF signal to form the first gas into a first plasma;
   stopping the flow of the first gas into the processing chamber;
   flowing a second gas into the processing chamber, wherein the second gas consists essentially of the inert gas;
   providing a second RF signal different from the first RF signal to form the second gas into a second plasma; and
   stopping the flow of the second gas into said processing chamber.

2. The method, as recited in claim 1, further comprising stabilizing the first plasma formed from the first gas.

3. The method, as recited in claim 2, wherein each cycle further comprises flowing a third gas into said processing chamber and stopping the flow of the third gas into said processing chamber.

4. The method, as recited in claim 3, wherein the third gas has a reactant gas to inert gas ratio that is different from the ratio of reactant gas to inert gas for the first gas and the second gas.

5. The method, as recited in claim 4, wherein the flowing the second gas is provided after the stopping the flow of the first gas.

6. The method, as recited in claim 5, wherein the second RF signal has an RF signal of a different frequency than the first RF signal, and wherein the frequency of the first RF signal and the frequency of the second RF signal are predetermined.

7. The method, as recited in claim 5, wherein the first gas has a different pressure than the second gas.

8. The method, as recited in claim 7, wherein the steps of stopping the flow of the first gas and the flowing of the second gas, comprise stopping the flow of the reactant gas while maintaining the flow of the inert gas.

9. The method, as recited in claim 1, wherein each cycle further comprises flowing a third gas into said processing chamber and stopping the flow of the third gas into said processing chamber.

10. The method, as recited in claim 9, wherein the third gas has a reactant gas to inert gas ratio that is different from the ratio of reactant gas to inert gas for the first gas and the second gas.

11. The method, as recited in claim 1, wherein the flowing the second gas is provided after the stopping the flow of the first gas.

12. The method, as recited in claim 1, wherein the second RF signal has an RF signal of a different frequency than the first RF signal, and wherein the frequency of the first RF signal and the frequency of the second RF signal are predetermined.

13. The method, as recited in claim 1, wherein the first gas has a different pressure than the second gas.

14. The method, as recited in claim 1, wherein the steps of stopping the flow of the first gas and the flowing of the second gas, comprise stopping the flow of the reactant gas while maintaining the flow of the inert gas.

15. The method, as recited in claim 1, wherein the first gas is formed by mixing a flow of the reactant gas with a flow of the inert gas.

16. The method, as recited in claim 15, wherein the flow of the reactant gas and the flow of the inert gas are mixed prior to flowing into the gas chamber, such that the resulting mixture is flowed into the gas chamber.

17. The method as recited in claim 15, wherein the second gas is formed by stopping the flow of the reactant gas without stopping the flow of the inert gas.

18. The method, as recited in claim 17, further comprising the step of increasing the flow of the inert gas to compensate at least partially for the pressure stop caused by stopping the flow of the reactant gas.

19. The method, as recited in claim 1, wherein a ratio of the amount of inert gas to reactant gas in the first gas is at least 1:9.

20. The method, as recited in claim 1, wherein the ratio of the amount of inert gas to reactant gas in the first gas is at least 3:7.

* * * * *